(12) United States Patent
Ohshitanai et al.

(10) Patent No.: US 9,596,425 B2
(45) Date of Patent: Mar. 14, 2017

(54) DRIVING METHOD FOR AN IMAGE PICKUP APPARATUS, IMAGE PICKUP APPARATUS, AND IMAGE PICKUP SYSTEM

(71) Applicant: CANON KABUSHIKI KAISHA, Tokyo (JP)

(72) Inventors: Kazuki Ohshitanai, Kawasaki (JP); Hiroo Akabori, Fujisawa (JP); Takeshi Akiyama, Yokohama (JP); Yoshiaki Takada, Kawasaki (JP); Masaaki Iwane, Sagamihara (JP); Koichiro Iwata, Kawasaki (JP); Hiroyuki Morita, Ebina (JP); Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/701,194

(22) Filed: Apr. 30, 2015

(65) Prior Publication Data
US 2015/0319388 A1    Nov. 5, 2015

(30) Foreign Application Priority Data
May 2, 2014    (JP) .................................. 2014-095493

(51) Int. Cl.
| H04N 5/217 | (2011.01) |
| H04N 9/64 | (2006.01) |
| H04N 3/14 | (2006.01) |
| H04N 5/335 | (2011.01) |
| H04N 5/378 | (2011.01) |
| H04N 5/369 | (2011.01) |
| H04N 5/3745 | (2011.01) |
| H04N 5/232 | (2006.01) |
| H04N 5/361 | (2011.01) |

(52) U.S. Cl.
CPC ......... *H04N 5/378* (2013.01); *H04N 5/23212* (2013.01); *H04N 5/361* (2013.01); *H04N 5/3698* (2013.01); *H04N 5/3745* (2013.01); *H04N 5/37457* (2013.01)

(58) Field of Classification Search
CPC .. H04N 5/3658; H04N 5/2176; H04N 5/2178; H04N 5/361; H04N 5/37457; H04N 5/378; H04N 3/1506; H04L 27/14623; H04L 27/14641; H04L 27/14609; G01J 2001/444
USPC .................................. 348/241–246, 300–302
See application file for complete search history.

(56) References Cited

U.S. PATENT DOCUMENTS

| 5,933,189 A | * | 8/1999 | Nomura | ................ | H04N 5/3575 |
| | | | | | 348/241 |
| 2006/0197858 A1 | * | 9/2006 | Masuyama | .......... | H04N 3/1568 |
| | | | | | 348/308 |
| 2008/0258047 A1 | * | 10/2008 | Sakakibara | ................ | G01J 1/44 |
| | | | | | 250/214 C |

(Continued)

FOREIGN PATENT DOCUMENTS

JP    2011-097646 A    5/2011

*Primary Examiner* — Chia-Wei A Chen
(74) *Attorney, Agent, or Firm* — Canon USA, Inc. IP Division

(57) ABSTRACT

The present invention provides a driving method for an image pickup apparatus that appropriately performs both readout of a signal of a reference pixel and mixing of mutual signals output by a plurality of effective pixels, and the present invention also provides an image pickup apparatus and an image pickup system.

17 Claims, 9 Drawing Sheets

(56) References Cited

U.S. PATENT DOCUMENTS

| | | | | |
|---|---|---|---|---|
| 2008/0303705 | A1* | 12/2008 | Sakakibara | H03M 1/0658 341/172 |
| 2010/0091160 | A1* | 4/2010 | Murakami | H04N 5/378 348/301 |
| 2010/0245647 | A1* | 9/2010 | Honda | H01L 27/14634 348/308 |
| 2010/0328511 | A1* | 12/2010 | Tashiro | H04N 5/3575 348/301 |
| 2011/0013050 | A1* | 1/2011 | Aruga | H04N 5/3598 348/241 |
| 2012/0320246 | A1* | 12/2012 | Ikuma | H04N 5/3575 348/300 |
| 2013/0082936 | A1* | 4/2013 | Islamkulov | H04N 5/378 345/173 |
| 2014/0092287 | A1* | 4/2014 | Jin | H04N 5/3745 348/301 |
| 2014/0139713 | A1* | 5/2014 | Gomi | H01L 27/14618 348/308 |
| 2014/0375855 | A1* | 12/2014 | Nishihara | H01L 27/14603 348/301 |
| 2015/0163438 | A1* | 6/2015 | Anjyou | H04N 5/3742 250/208.1 |
| 2015/0237278 | A1* | 8/2015 | Sakakibara | H04N 5/3698 348/301 |

* cited by examiner

DRIVING METHOD FOR AN IMAGE PICKUP APPARATUS, IMAGE PICKUP APPARATUS, AND IMAGE PICKUP SYSTEM

BACKGROUND

Technical Field

The present disclosure relates to a driving method for an image pickup apparatus, an image pickup apparatus, and an image pickup system.

Description of the Related Art

An image pickup apparatus in which pixels are arranged in a matrix comprising rows and columns has been proposed. An image pickup apparatus described in Japanese Patent Laid-Open No. 2011-097646 has a configuration in which signals output from pixels in a plurality of columns which are electrically connected to a single signal line are mixed with one another on the signal line.

SUMMARY

An aspect of the present invention relates to a driving method for an image pickup apparatus that includes a plurality of pixels arranged in rows and columns, and a plurality of signal lines each being arranged corresponding to one of the columns of the plurality of pixels, the plurality of pixels including a plurality of effective pixels arranged in the rows and the columns, and a plurality of reference pixels arranged in at least one row and the columns corresponding to the columns in which the plurality of effective pixels are arranged and outputting only a signal of a noise level, each of the plurality of effective pixels including a photoelectric conversion unit to perform a photoelectric conversion of incident light and an amplification transistor having an input node for inputting charges generated by the photoelectric conversion unit, and each of the plurality of reference pixels including an amplification transistor having an input node, the driving method including: a first operation of overlapping a first period with a second period during which a signal generated based on the charges generated by the photoelectric conversion unit in each of the plurality of effective pixels is output to one of the signal lines by connecting a plurality of amplification transistors in a first number of the plurality of effective pixels, to the one of the signal lines, without electrically connecting the input node of the amplification transistor in each of the plurality of effective pixels, and a second operation of: individually outputting the signal of the noise level to the single signal line by the amplification transistor in each of the plurality of reference pixels, or overlapping a third period with a fourth period when a signal generated based on a potential at the input node of each of the plurality of reference pixels is output to the one of signal lines by connecting a plurality of amplification transistors in a second number of the plurality of reference pixels, to the one of the signal lines, without electrically connecting the input node of the amplification transistor in each of the plurality of reference pixels to the other of the plurality of reference pixels, the second number being fewer than the first number.

In addition, another aspect of the present invention relates to a driving method for an image pickup apparatus that includes a plurality of pixels arranged in rows and columns, and a plurality of signal lines each being arranged correspond to one of the columns of the plurality of pixels, the plurality of pixels including a plurality of effective pixels arranged in the rows and the columns, and reference pixels arranged in at least one row and the columns corresponding to the columns in which the plurality of effective pixels are arranged, each of the plurality of effective pixels including a photoelectric conversion unit to perform a photoelectric conversion of incident light and an amplification transistor having an input node for inputting charges generated by the photoelectric conversion unit, and each of the plurality of reference pixels including a light-shielded photoelectric conversion unit and an amplification transistor having an input node, the driving method including: a first operation of overlapping a first period with a second period during which a signal generated based on the charges generated by the photoelectric conversion unit in each of the plurality of effective pixels is output to one of the signal lines by connecting a plurality of amplification transistors in a first number of the plurality of effective pixels, to the one of the signal lines, without electrically connecting the input node of the amplification transistor in each of the plurality of effective pixels, and a second operation of: individually outputting the signal of the noise level to the single signal line by the amplification transistor in each of the plurality of reference pixels, or overlapping a third period with a fourth period when a signal generated based on a potential at the input node of each of the plurality of reference pixels is output to the one of signal lines by connecting a plurality of amplification transistors in a second number of the plurality of reference pixels, to the one of the signal lines, without electrically connecting the input node of the amplification transistor in each of the plurality of reference pixels to the other of the plurality of reference pixels, the second number being fewer than the first number.

In addition, another aspect of the present invention relates to an image pickup apparatus including: a plurality of pixels arranged in rows and columns; a plurality of signal lines each being arranged to correspond to one of the columns of the plurality of pixels; and a control unit that causes the plurality of pixels to perform both a first operation and a second operation, the plurality of pixels including a plurality of effective pixels arranged in the rows and the columns, and a plurality of reference pixels that are arranged in at least one row and the columns corresponding to the columns in which the plurality of effective pixels are arranged and output only a signal of a noise level, each of the plurality of effective pixels including a photoelectric conversion unit to perform a photoelectric conversion of incident light and an amplification transistor having an input node to which charges generated by the photoelectric conversion unit are input, and each of the plurality of reference pixels including an amplification transistor having an input node, a first operation of overlapping a first period with a second period during which a signal generated based on the charges generated by the photoelectric conversion unit in each of the plurality of effective pixels is output to one of the signal lines by connecting a plurality of amplification transistors in a first number of the plurality of effective pixels, to the one of the signal lines, without electrically connecting the input node of the amplification transistor in each of the plurality of effective pixels, and a second operation of: individually outputting the signal of the noise level to the single signal line by the amplification transistor in each of the plurality of reference pixels, or overlapping a third period with a fourth period when a signal generated based on a potential at the input node of each of the plurality of reference pixels is output to the one of signal lines by connecting a plurality of amplification transistors in a second number of the plurality of reference pixels, to the one of the signal lines, without electrically connecting the input node of the amplification transistor in each of the plurality of reference pixels to the other of the plurality of reference pixels, the second number being fewer than the first number.

Further features of the present invention will become apparent from the following description of exemplary embodiments with reference to the attached drawings.

DESCRIPTION OF THE EMBODIMENTS

However, according to the technology described in Japanese Patent Laid-Open No. 2011-097646, review for appropriately performing both readout of a signal of a reference pixel that only outputs a signal different from a signal of an effective pixel such as a noise level and mixing of mutual signals output from a plurality of effective pixels has not been conducted. Hereinafter, a technology for addressing this problem will be described.

First Exemplary Embodiment

Figure 1A:
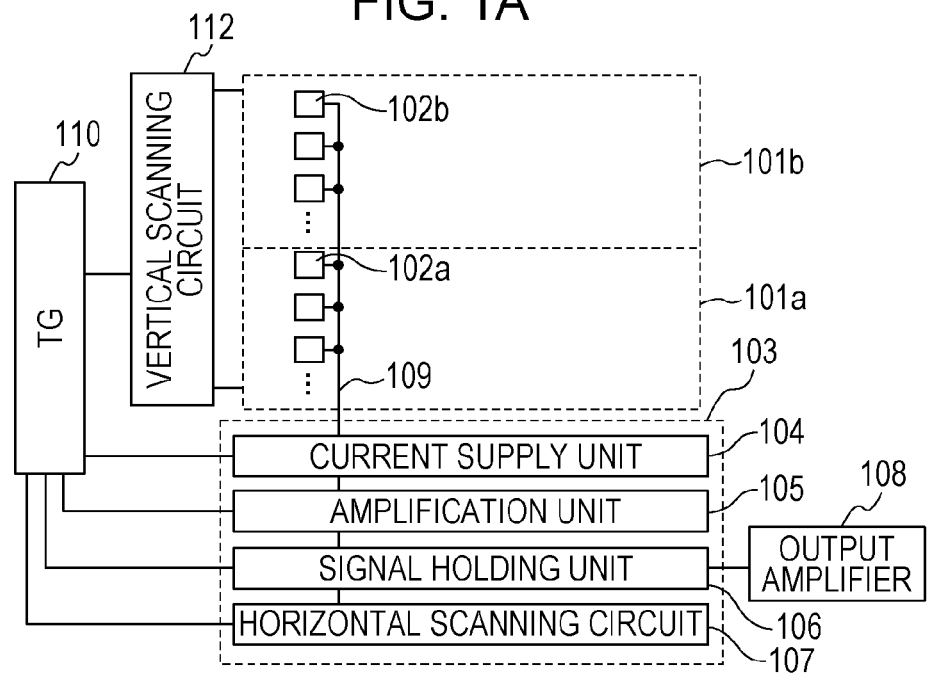
FIGS. 1A and 1B illustrate an example of a configuration of an image pickup apparatus and an example of a configuration of a pixel.

FIG. 1A illustrates a configuration of an image pickup apparatus according to the present exemplary embodiment. A pixel array 100 is provided with an effective pixel area 101a in which effective pixels 102a are arranged in a matrix comprising rows and columns, and an OB pixel area 101b in which optical black pixels (hereinafter, will be referred to as OB pixels) 102b are arranged in a matrix. The OB pixel 102b is an example of a reference pixel that only outputs a signal of a noise level according to the present exemplary embodiment. The OB pixel area 101b is adjacent to the effective pixel area 101a. The effective pixel 102a outputs both a noise signal corresponding to the signal of the noise level and a signal based on charges generated by a photoelectric conversion of incident light (hereinafter, will be referred to as photoelectric conversion signal) to a signal line 109. The OB pixel 102b outputs the noise signal corresponding to the signal of the noise level to the signal line 109. Hereinafter, the noise signal output by the effective pixel 102a will be referred to as effective noise signal, and the noise signal output by the OB pixel 102b will be referred to as OB noise signal. It is noted that the effective pixels 102a, the OB pixels 102b, and the signal line 109 are illustrated only in one column in FIG. 1A, but in actuality, the effective pixels 102a, the OB pixels 102b, and the signal lines 109 are provided across several thousands of columns. Hereinafter, pixels collectively represented by including the effective pixels 102a and the OB pixels 102b are referred to as pixels 102.

A vertical scanning circuit 112 sequentially scans the effective pixels 102a and the OB pixels 102b for each row. The effective pixel 102a located in a row selected by the vertical scanning circuit 112 outputs both the effective noise signal and the photoelectric conversion signal to the signal line 109. The OB pixel 102b located in the row selected by the vertical scanning circuit 112 outputs the OB noise signal to the signal line 109. The vertical scanning circuit 112 is an example of a control unit.

A signal processing circuit 103 is provided with a current supply unit 104, an amplification unit 105, a signal holding unit 106, and a horizontal scanning circuit 107. Although the current supply unit 104 is illustrated as a single block, a plurality of current supply units 104 each provided while corresponding to the signal line 109 in each of the columns are collectively illustrated as a single block. In addition, the same applies to the amplification unit 105 and the signal holding unit 106. A plurality of amplification units 105 and a plurality of the signal holding units 106 each provided while corresponding to the signal line 109 in each of the columns are respectively illustrated as single blocks.

The horizontal scanning circuit 107 sequentially scans the signal holding units 106 in the respective columns. Accordingly, the signals held by the signal holding units 106 in the respective columns are sequentially transferred from the signal holding units 106 in the respective columns to an output amplifier 108. The output amplifier 108 outputs signals obtained by amplifying the signals output from the signal holding units 106 in the respective columns to an external part of the image pickup apparatus.

A timing generator 110 (hereinafter, will be referred to as TG 110) controls operations of the current supply unit 104, the amplification unit 105, the signal holding unit 106, the horizontal scanning circuit 107, and the vertical scanning circuit 112.

The vertical scanning circuit 112 can change the number of rows of the pixels selected at the same time on the basis of the control from the TG 110.

Figure 1B:
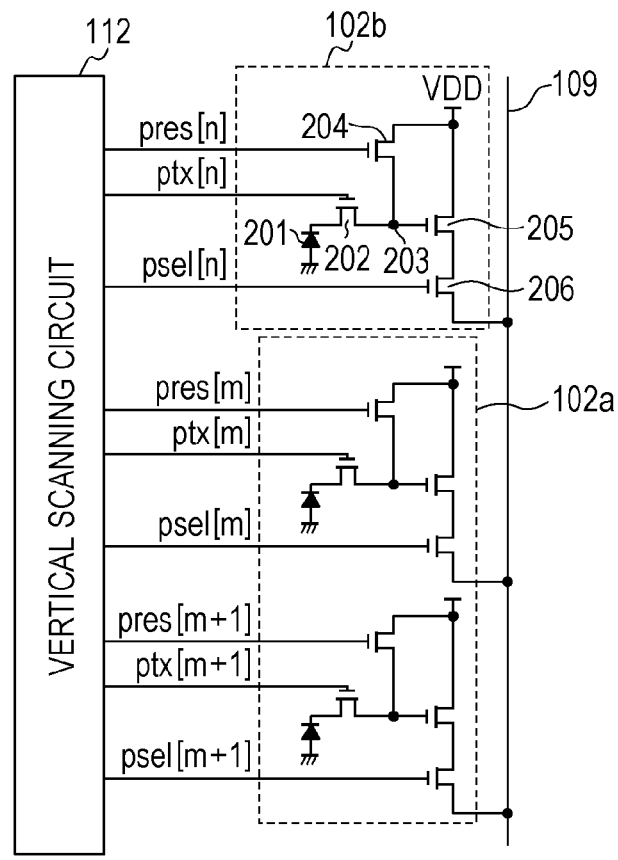

FIG. 1B illustrates respective circuit configurations of the effective pixel 102a and the OB pixel 102b according to the present exemplary embodiment. In FIG. 1B, reference symbols are assigned to elements provided in the OB pixel 102b. The effective pixel 102a and the OB pixel 102b have the same configuration except that light is shielded in a photoelectric conversion unit 201 in the OB pixel 102b.

The photoelectric conversion unit 201 generates charges based on incident light. A transistor 202 is provided on an electric path between the photoelectric conversion unit 201 and a floating diffusion unit (hereinafter, will be referred to as FD unit corresponding to initial letters of floating diffusion) 203. The transistor 202 is a transfer transistor that controls ON and OFF of charge transfer from the photoelectric conversion unit 201 to the FD unit 203. One main node of a transistor 204 is electrically connected to the FD unit 203, and the other main node is supplied with a power supply voltage VDD. The transistor 204 is a reset transistor that controls ON and OFF of potential reset of the FD unit 203. An input node of a transistor 205 is electrically connected to the FD unit 203, one main node is supplied with the power supply voltage VDD, and the other main node is electrically connected to one main node of a transistor 206. The transistor 205 is an amplification transistor that outputs a signal based on the potential of the FD unit 203. The other main node of the transistor 206 is electrically connected to the signal line 109. The transistor 206 is a selection transistor that switches a conductive state and a non-conductive state between the transistor 205 functioning as the amplification transistor and the signal line 109. Control nodes of the transistor 202, the transistor 204, the transistor 206 are respectively supplied with a signal ptx, a signal pres, and a signal psel in the stated order from the vertical scanning circuit 112.

The transistor 205 in the pixel 102 performs a source follower operation by using the current supplied from the current supply unit 104 and the power supply voltage VDD.

Pulses for driving the OB pixels 102b on an n-th row are set as pres[n], ptx[n], and psel[n], and pulses for driving the effective pixels 102a on an m-th row are set as pres[m], ptx[m], and psel[m].

Figure 2:
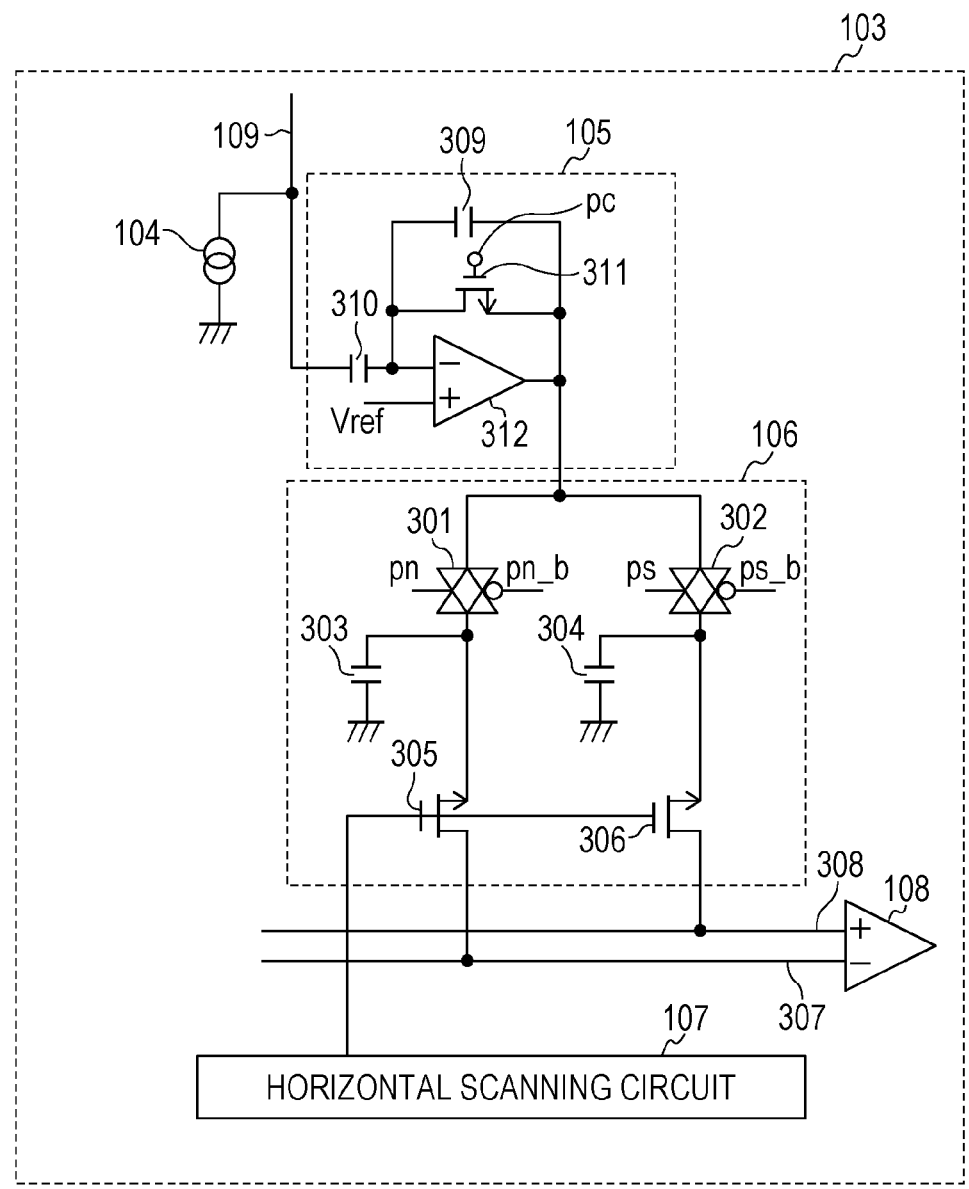
FIG. 2 illustrates an example of a configuration of a signal processing circuit.

FIG. 2 is a circuit diagram for one column of the signal processing circuit 103 illustrated in FIG. 1A.

The current source corresponding to the current supply unit 104 supplies the current to the transistor 205 in the pixel 102 via the signal line 109.

The amplification unit 105 includes a feedback capacitance 309, an input capacitance 310, a switch 311, and a differential amplifier 312. An inverting node of the differential amplifier 312 is electrically connected to one node of the input capacitance 310, one node of the feedback capacitance 309, and one node of the switch 311. A reference voltage Vref is input to a non-inverting node of the differential amplifier 312. An output node of the differential amplifier 312 is electrically connected to the other node of the feedback capacitance 309, the other node of the switch 311, and the signal holding unit 106.

The signal holding unit 106 is constituted by a switch 301, a switch 302, an N-signal holding capacitance 303, an S-signal holding capacitance 304, a switch 305, and a switch 306. The switch 301 and the switch 302 are both a CMOS switch. ON and OFF of the switch 301 are controlled by a signal pn output from the TG 110 and a signal pn_b corresponding to an inverted signal of the signal pn. ON and OFF of the switch 302 are controlled by a signal ps output from the TG 110 and a signal ps_b corresponding to an inverted signal of the signal ps.

The horizontal scanning circuit 107 controls ON and OFF of the switch 305 and ON and OFF of the switch 306. When the switch 305 is turned ON, the signal held by the N-signal holding capacitance 303 is output to the output amplifier 108. When the switch 306 is turned ON, the signal held by the S-signal holding capacitance 304 is output to the output amplifier 108. The output amplifier 108 outputs a signal obtained by amplifying the signal held by the N-signal holding capacitance 303 and the signal held by the S-signal holding capacitance 304.

Figure 3:
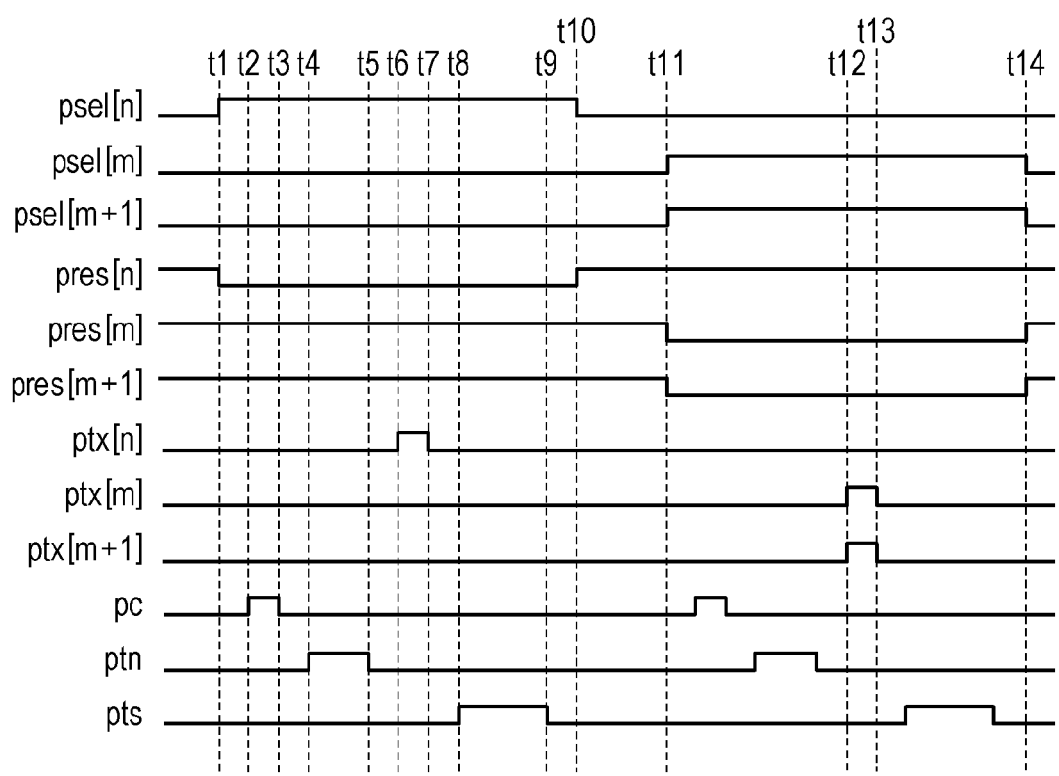
FIG. 3 illustrates an example of an operation of the image pickup apparatus.

FIG. 3 is a driving timing chart of the image pickup apparatus illustrated in FIG. 1A.

The image pickup apparatus mixes the signals of the effective pixels 102a in X rows (X is a number higher than or equal to 2) with one another on the single signal line 109. The image pickup apparatus also mixes the signals of the OB pixels 102b in Y rows that are fewer than the X rows with one another on the single signal line 109. A case where X=2 and Y=1 are set in the image pickup apparatus according to the present exemplary embodiment will be described.

In the operation illustrated in FIG. 3, each of the FD units 203 in the effective pixels 102a in a plurality of rows holds the charges generated by the photoelectric conversion unit 201 in each of the effective pixels 102a. Subsequently, the vertical scanning circuit 112 selects the effective pixels 102a in the plurality of rows at the same time. That is, a period for outputting the signal based on the charges generated by each of the photoelectric conversion units 201 by each of the transistors 205 in the plurality of effective pixels 102a is overlapped with one another. Accordingly, the signal output from each of the effective pixels 102a in the plurality of rows is mixed with one another on the signal line 109. Each of the FD units 203 in the OB pixels 102b in a plurality of rows holds charges based on a dark current component generated by the photoelectric conversion unit 201 in each of the OB pixels 102b. Subsequently, the vertical scanning circuit 112 individually selects the OB pixels 102b on the respective rows. Accordingly, the signal is output from the OB pixel 102b for one row each to the signal line 109 without being mixed with the other signals.

In FIG. 3, the operation related to the OB pixel 102b is performed during a period from a time t1 to a time t10. The operation related to the effective pixel 102a is performed during a period from a time t11 to a time t14.

The respective signals illustrated in FIG. 3 correspond to the respective signals illustrated in FIG. 1B and FIG. 2.

The signal ptx, the signal pres, and the signal psel illustrated in FIG. 3 are signals for respectively controlling the transistor 202, the transistor 204, and the transistor 206 in the stated order.

At the time t1, pres[n] turns to a Low level (hereinafter, will be referred to as Lo) to turn the transistor 204 OFF. Accordingly, reset of the FD unit 203 is cancelled. The vertical scanning circuit 112 sets the signal psel[n] on the selected row to a High level (hereinafter, will be referred to as Hi). Accordingly, the transistor 206 in the OB pixel 102b on the n-th row is turned ON. Accordingly, the transistor 205 in the OB pixel 102b on the n-th row is connected to the signal line 109 via the transistor 206.

At the time t2, the TG 110 sets the signal pc for controlling the switch 311 to Hi. Subsequently, the TG 110 sets the pulse pc to Lo at the time t3. Accordingly, a potential at the signal line 109 based on a potential at the reset FD unit 203 is clamped by the input capacitance 310. The output of the amplification unit 105 at the time t3 corresponds to a reference potential Vref.

At the time t4, the TG 110 sets the signal ptn to Hi. Accordingly, the switch 301 is turned ON. Subsequently, at the time t5, the TG 110 sets the signal ptn to Lo. As a result, the N-signal holding capacitance 303 holds a signal output by the amplification unit 105 at the time t5 (hereinafter, will be referred to as N-signal). The N-signal is a signal having an offset variation for each column of the amplification unit 105 as a main component.

At the time t6, the vertical scanning circuit 112 sets the signal ptx[n] to Hi.

Subsequently, at the time t7, the vertical scanning circuit 112 sets the signal ptx[n] to Lo. Accordingly, the FD unit 203 holds the charges based on the dark current component generated by the photoelectric conversion unit 201 in the OB pixel 102b. The transistor 205 outputs the signal based on this potential at the FD unit 203 to the signal line 109 via the transistor 206.

A signal corresponding to a difference between the potential clamped by the input capacitance 310 at the time t3 and the signal line 109 at the time t6 is input to an inverting input node of the differential amplifier 312.

The amplification unit 105 outputs a signal obtained by amplifying the signal input to the inverting input node to the signal holding unit 106.

This amplification factor of the differential amplifier 312 is determined on the basis of a ratio of capacitance values between the input capacitance 310 and the feedback capacitance 309. This output signal obtained by amplifying the signal based on the charges generated by the photoelectric conversion unit 201 by the amplification unit 105 is referred to as S-signal.

At the time t8, the TG 110 sets the signal pts to Hi. Accordingly, the switch 302 is turned ON. Thereafter, at the time t9, the TG 110 sets the signal pts to Lo. As a result, the S-signal holding capacitance 304 holds the S-signal output by the amplification unit 105.

In addition, at the time t9, the vertical scanning circuit 112 sets the signal psel[n] to Lo.

Subsequently, the horizontal scanning circuit 107 scans the signal holding units 106 in the respective columns. That is, the switches 305 and the switches 306 in the respective columns are sequentially turned ON. Accordingly, each of the S-signal and the N-signal held by the signal holding units 106 in the respective columns is output to the output amplifier 108.

Next, the operation related to the effective pixel 102a will be described. A difference from the previously described operation related to the OB pixel 102b will be mainly described hereinafter.

At the time t11, the vertical scanning circuit 112 sets both the signal psel[m] and the signal psel[m+1] to Hi. Accordingly, the transistors 206 in the effective pixels 102a on the m-th row and the (m+1)-th row are turned ON at the same time. In addition, at the time t11, the vertical scanning circuit 112 sets both the signal pres[m] and the signal pres[m+1] to Lo. Accordingly, the transistor 205 in the effective pixel 102a on the m-th row outputs the signal based on the potential at the reset FD unit 203 to the signal line 109. Similarly, the transistor 205 in the effective pixel 102a on the (m+1)-th row outputs the signal based on the potential at the reset FD unit 203 to the signal line 109. Accordingly, the signal output by the transistor 205 in the effective pixel 102a on the m-th row is mixed with the signal output by the transistor 205 in the effective pixel 102a on the (m+1)-th row on the signal line 109.

Thereafter, the TG 110 sets the signal pc to Hi, and then the signal pc is set to Lo. Thereafter, the TG 110 sets the signal ptn to Hi, and then the signal ptn is set to Lo. Accordingly, the N-signal holding capacitance 303 holds the N-signal.

At the time t12, the vertical scanning circuit 112 sets both the signal ptx[m] and the signal ptx[m+1] to Hi. Subsequently, at the time t13, the vertical scanning circuit 112 sets both the signal ptx[m] and the signal ptx[m+1] to Lo. Accordingly, the transistor 205 in the effective pixel 102a on the m-th row outputs the signal based on the charges generated while the photoelectric conversion unit 201 performs the photoelectric conversion of the incident light to the signal line 109. Similarly, the transistor 205 in the effective pixel 102a on the (m+1)-th row outputs the signal based on the charges generated while the photoelectric conversion unit 201 performs the photoelectric conversion of the incident light to the signal line 109. Accordingly, the signal output by the transistor 205 in the effective pixel 102a on the m-th row is mixed with the signal output by the transistor 205 in the effective pixel 102a on the (m+1)-th row on the signal line 109.

Thereafter, the TG 110 sets the signal pts to Hi, and then the signal pts is set to Lo. Accordingly, the S-signal holding capacitance 304 holds the S-signal.

Subsequently, the horizontal scanning circuit 107 scans the signal holding units 106 in the respective columns. That is, the switches 305 and the switches 306 in the respective columns are sequentially turned ON. Accordingly, each of the S-signal and the N-signal held by the signal holding units 106 in the respective columns is output to the output amplifier 108.

The image pickup apparatus according to the present exemplary embodiment mixes the signals output by the effective pixels 102a in the plurality of rows with one another on the single signal line 109. On the other hand, the image pickup apparatus according to the present exemplary embodiment independently reads out the signal output by the OB pixel 102b for one row each.

With regard to the OB pixels 102b too, descriptions will be given of a case where the signals output by the OB pixels 102b in the plurality of rows are mixed with one another on the signal line 109 similarly as in the effective pixels 102a. In this case, to obtain the ten S-signals of the OB pixels 102b in the respective columns, the OB pixels 102b on 20 rows are provided in a case where the signals output by the OB pixels 102b in two rows are mixed with one another.

On the other hand, since the image pickup apparatus according to the present exemplary embodiment individually reads out the OB pixels 102b for each row, the OB pixels 102b in ten rows may be provided. Therefore, the image pickup apparatus according to the present exemplary embodiment can reduce the area of the OB pixel area 101b by a size corresponding to the OB pixels 102b in ten rows.

Therefore, in the OB pixel area 101b too, the image pickup apparatus according to the present exemplary embodiment has the effect of reducing the area of the pixel array as compared with the case where the signals output by the OB pixels 102b in the plurality of rows are mixed with one another on the signal line 109.

By electrically connecting the FD units 203 in the plurality of effective pixels 102a arranged in the X rows to one another, a combined capacitance (hereinafter, will be referred to as combined capacitance A) may be generated, and the charges of the plurality of photoelectric conversion units 201 may be mixed with one another by the combined capacitance A in some cases. That is, this case corresponds to a case where the input nodes of the transistors 205 in the plurality of effective pixels 102a arranged in the X rows are electrically connected to one another. Hereinafter, descriptions will be given of a situation where the FD unit 203 in the OB pixel 102b is not electrically connected to the other OB pixel 102b in this case. The single FD unit 203 holds the charges of the photoelectric conversion unit 201 in the OB pixel 102b in this case. Thus, the charges of the photoelectric conversion unit 201 in the OB pixel 102b is held by a capacitance value of the FD unit 203 which is lower than a capacitance value of the combined capacitance A. Therefore, a noise component included in the signal output by the transistor 205 in the OB pixel 102b tends to have a larger amplitude than a noise component included in the signal output by the transistor 205 which is based on the charges mixed by the combined capacitance A. Accordingly, even when the signal output by the image pickup apparatus which is based on the charges of the OB pixel 102b is subtracted from the signal output by the transistor 205 which is based on the charges mixed by the combined capacitance A, the noise component is not accurately reduced. Therefore, the quality of the image generated on the basis of the signal output by the image pickup apparatus is decreased.

Meanwhile, the image pickup apparatus according to the present exemplary embodiment mixes the signals output by the plurality of transistors 205 in the effective pixel area 101a with one another on the signal line 109. Accordingly, an amplitude difference between the noise component included in the signal based on the charges of the plurality of effective pixels 102a and the noise component included in the signal based on the charges of the OB pixel 102b hardly occurs. Therefore, the image pickup apparatus according to the present exemplary embodiment has the effect with which the area of the pixel array can be reduced while the decrease in the image quality is suppressed.

A signal corresponding to a difference between the signal based on the output of the OB pixel 102b and the signal based on the output of the effective pixel 102a is generated in an external part of the image pickup apparatus. Accordingly, it is possible to generate a signal in which the dark current component is reduced from the signal based on the output of the effective pixel 102a. Accordingly, an influence of a fluctuation by a temperature of a reference for the black color of the image generated on the basis of the signal output by the image pickup apparatus can be reduced. Accordingly, it is possible to improve the quality of the image generated on the basis of the signal output by the image pickup apparatus according to the present exemplary embodiment.

According to the present exemplary embodiment, the example in which the reference pixel that only outputs the signal of the noise level is the OB pixel 102b has been described. As another example, the reference pixel may be a dummy pixel in which the photoelectric conversion unit 201 provided in the OB pixel 102b is omitted.

According to the present exemplary embodiment, the configuration in which each of the pixels 102 switches the conductive state and the non-conductive state of the electric path between the transistor 205 and the signal line 109 by ON and OFF of the transistor 206 has been described. As another example, a configuration in which each of the pixels 102 does not include the transistor 206 may also be adopted. In this case, the power supply voltage VDD supplied to the transistor 204 is set as a first voltage, and a voltage having a voltage value different from the first voltage is set as a second voltage. When the transistor 204 is turned ON in a case where the first voltage is supplied, the FD unit 203 is set to have a potential at which the transistor 205 does not output the signal to the signal line 109. On the other hand, when the transistor 204 is turned ON in a case where the second voltage is supplied, the FD unit 203 is set to have a potential at which the transistor 205 outputs the signal to the signal line 109. Accordingly, the transistor 205 in which the FD unit 203 is set to have the potential based on the second voltage outputs the signal to the signal line 109. Therefore, by switching the voltage supplied to the transistor 204 between the first voltage and the second voltage, it is possible to select the pixel 102 that outputs the signal to the signal line 109. In the image pickup apparatus according to the present exemplary embodiment, in a case where the signals of the pixels 102 in a plurality of rows are mixed with one another on the signal line 109, the voltage supplied to the transistor 204 in the pixels 102 in the plurality of rows is set as the second voltage. Accordingly, the image pickup apparatus according to the present exemplary embodiment can mix the signal output by each of the plurality of pixels 102 with one another on the signal line 109.

According to the present exemplary embodiment, in a state in which all the transistors 206 in the plurality of effective pixels 102a are ON, a current flowing through the transistor 205 of each of the plurality of effective pixels 102a fluctuates in accordance with the potential at the FD unit 203 in each of the plurality of effective pixels 102a. Even in a case where the current flowing through the transistor 205 fluctuates as described above, according to the present exemplary embodiment, the operation for the transistor 205 to output the signal based on the potential at the FD unit 203 to the signal line 109 is dealt with as the source follower operation. This also applies to the subsequent exemplary embodiments.

According to the present exemplary embodiment, the example in which the OB pixels 102b corresponding to the example of the reference pixel are arranged in the plurality of rows has been described, but it suffices if the OB pixel 102b on at least one row may be provided in the image pickup apparatus according to the present exemplary embodiment.

Second Exemplary Embodiment

With regard to the image pickup apparatus according to the present exemplary embodiment, a difference from the first exemplary embodiment will be mainly described.

The image pickup apparatus mixes the signals of the effective pixel 102a in X rows (X is a number higher than or equal to 2) with one another on the single signal line 109. The image pickup apparatus also mixes the signals of the OB pixels 102b in Y rows that are fewer than the X rows on the single signal line 109 with one another. A case where X=3 and Y=2 are set in the image pickup apparatus according to the present exemplary embodiment will be described.

The configuration of the image pickup apparatus according to the present exemplary embodiment is the same as that in FIG. 1A described in the first exemplary embodiment. The configuration of the pixel 102 according to the present exemplary embodiment is the same as that in FIG. 1B described in the first exemplary embodiment. In addition, the configurations of the amplification unit 105 and the signal holding unit 106 according to the present exemplary embodiment are the same as those in FIG. 2 described in the first exemplary embodiment.

Figure 4:
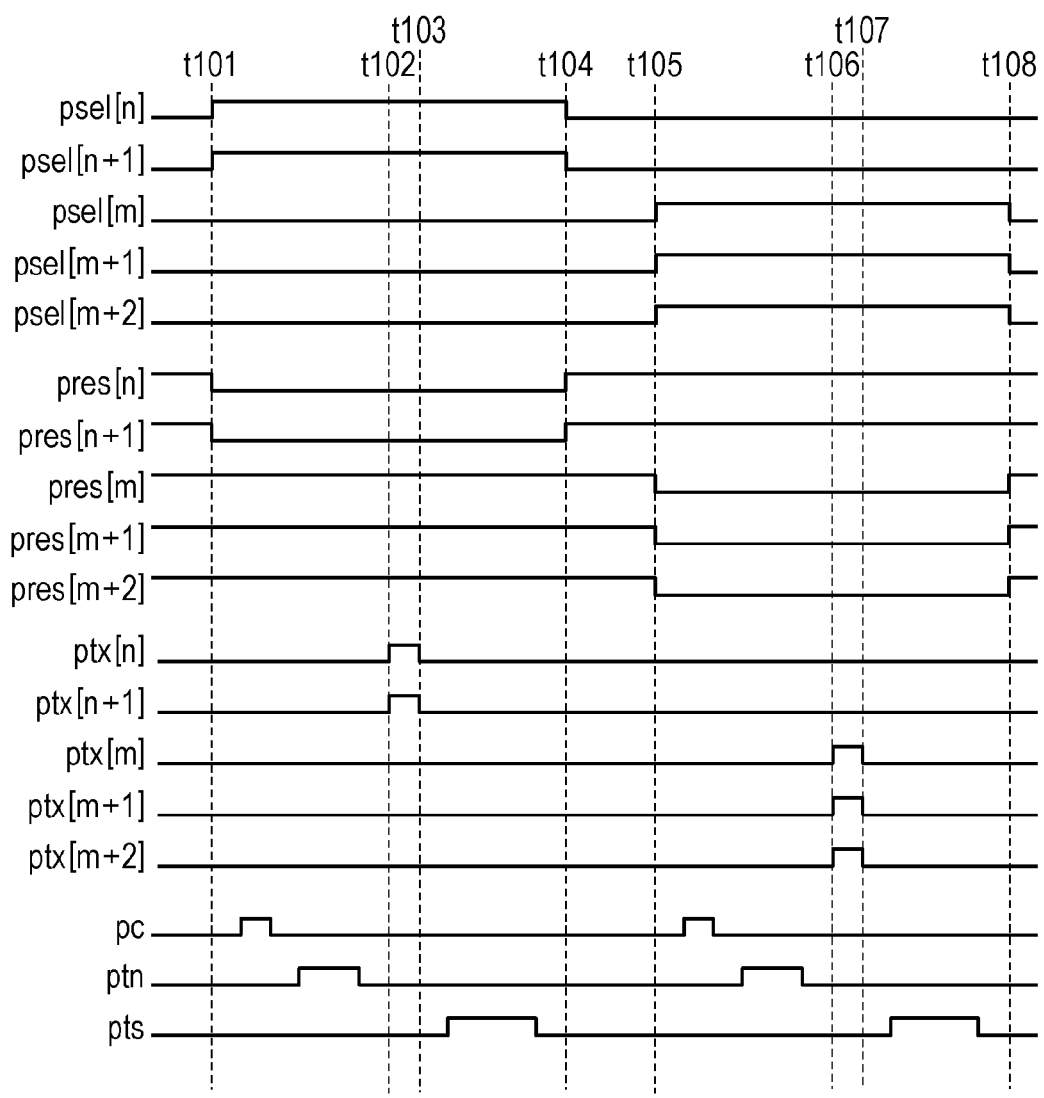
FIG. 4 illustrates another example of the operation of the image pickup apparatus.

FIG. 4 is a timing chart illustrating the operation of the image pickup apparatus according to the present exemplary embodiment. The operation of mixing the signals of the OB pixels 102b in the Y rows with one another on the single signal line 109 is performed during a period from a time t101 to a time t104. The operation of mixing the signals of the effective pixels 102a in the X rows with one another on the single signal line 109 is performed during a period from a time t105 to a time t108.

At the time t101, the vertical scanning circuit 112 sets both the signal pres[n] and the signal pres[n+1] to Lo. Accordingly, reset of the FD unit 203 in the OB pixel 102b is cancelled.

In addition, at the time t101, the vertical scanning circuit 112 sets both the signal psel[n] and the signal psel[n+1] to Hi. Accordingly, the transistors 206 in the OB pixels 102b in the n-th row and the (n+1)-th row are turned ON. Accordingly, the signal output by the transistor 205 in the OB pixel 102b in the n-th row and the signal output by the transistor 205 in the OB pixel 102b in the (n+1)-th row are mixed with one another on the signal line 109.

Thereafter, the TG 110 sets the signal pc to Hi, and then the signal pc is set to Lo. Accordingly, the potential at the signal line 109 when the TG 110 sets the signal pc to Lo is clamped by the input capacitance 310.

Thereafter, the TG 110 sets the signal pn to Hi, and then the signal pn is set to Lo. Accordingly, the N-signal holding capacitance 303 holds the signal output by the amplification unit 105.

Thereafter, the vertical scanning circuit 112 selects the effective pixels 102a in three rows at the same time. The other operation is the same as the operation of mixing the signal output by each of the effective pixels 102*a* in the plurality of rows with one another which has been described in the first exemplary embodiment.

According to the present exemplary embodiment, the signal output by each of the effective pixels 102*a* in the three rows is mixed with one another, and the signal output by each of the OB pixels 102*b* in the two rows is mixed with one another. Meanwhile, descriptions will be given of a case where the signal output by each of the OB pixels 102*b* in the same three rows is mixed with one another as the case where the signal output by each of the effective pixels 102*a* in the three rows is mixed with one another. In this case, when ten S-signals output from the OB pixel area 101*b* are to be used, the OB pixels 102*b* in 30 rows are to be provided. However, like the present exemplary embodiment, by mixing the signals output by the OB pixel 102*b* in the two rows with one another, it suffices if the OB pixels 102*b* in 20 rows are provided. Therefore, as compared with the case where the signal output from each of the OB pixels 102*b* in the three rows is mixed with one another, the area of the OB pixel area 101*b* can be reduced by a size corresponding to the OB pixels 102*b* in ten rows.

The image pickup apparatus according to the present exemplary embodiment mixes the signal output by each of the effective pixels 102*a* in the X rows with one another on the single signal line 109. Subsequently, the signal output by each of the OB pixels 102*b* in the Y rows that are fewer than X rows with one another on the single signal line 109. Accordingly, as compared with the case where the signals output by the OB pixels 102*b* in the same three rows are mixed with one another as the case where the signal output by the effective pixels 102*a* in the three rows are mixed with one another, it is possible to reduce the area of the OB pixel area 101*b*. Thus, the image pickup apparatus according to the present exemplary embodiment can reduce the area of the pixel array.

By electrically connecting the FD units 203 in the plurality of effective pixels 102*a* arranged in the X rows to one another, a combined capacitance (hereinafter, will be referred to as combined capacitance A) may be generated, and the charges of the plurality of photoelectric conversion units 201 may be mixed with one another in the combined capacitance A in some cases. Hereinafter, descriptions will be given of a situation in which the FD units 203 in the plurality of OB pixels 102*b* arranged in the Y rows that are fewer than the X rows are electrically connected to each other in this case. By electrically connecting the FD units 203 in the OB pixels 102*b* in the Y rows with one another, a combined capacitance (hereinafter, will be referred to as combined capacitance B) is generated, and the charges of the plurality of photoelectric conversion units 201 are mixed with one another in the combined capacitance B in this case. Thus, a capacitance value of the combined capacitance B is a value lower than the capacitance value of the combined capacitance A. Therefore, a noise component included in the signal output by the transistor 205 which is based on the charges mixed by the combined capacitance B tends to have a larger amplitude than a noise component included in the signal output by the transistor 205 which is based on the charges mixed by the combined capacitance A. Accordingly, even when the signal output by the image pickup apparatus which is based on the charges mixed by the combined capacitance B is subtracted from the signal output by the image pickup apparatus which is based on the charges mixed by the combined capacitance A, the noise component is not accurately reduced. Therefore, the quality of the image generated on the basis of the signal output by the image pickup apparatus is decreased.

Meanwhile, the image pickup apparatus according to the present exemplary embodiment mixes the signals output by the plurality of transistors 205 with one another on the signal line 109 in each of the effective pixel area 101*a* and the OB pixel area 101*b*. Accordingly, an amplitude difference between the noise component included in the signal based on the charges of the plurality of effective pixels 102*a* and the noise component included in the signal based on the charges of the plurality of OB pixels 102*b* hardly occurs. Therefore, the image pickup apparatus according to the present exemplary embodiment has the effect with which the area of the pixel array can be reduced while the decrease in the image quality is suppressed.

Third Exemplary Embodiment

With regard to the image pickup apparatus according to the present exemplary embodiment, a difference from the first exemplary embodiment will be mainly described. The image pickup apparatus according to the present exemplary embodiment sets a voltage difference of control voltages for controlling ON and OFF of the transistor 204 in the reference pixel to be smaller than a voltage difference of control voltages for controlling ON and OFF of the transistor 204 in the effective pixel 102*a*. The control voltage for controlling ON and OFF of the transistor 204 is equivalent to the signal pres output by the vertical scanning circuit 112.

The configuration of the image pickup apparatus according to the present exemplary embodiment is the same as the configuration illustrated in FIG. 1A, FIG. 1B, and FIG. 2 described in the first exemplary embodiment.

In the image pickup apparatus according to the first exemplary embodiment, the signal of the OB pixel 102*b* is output from the single transistor 205 to the signal line 109. On the other hand, the signal of the effective pixel 102*a* is output from the two transistors 205 to the signal line 109. Herein, a period from when the signal of the OB pixel 102*b* at the same signal level starts to be output to the signal line 109 until the signal becomes statically determinate at the signal level is compared with a period from when the mixed signal of the effective pixel 102*a* starts to be output to the signal line 109 until the signal becomes statically determinate at the signal level. The number of transistors 205 in the OB pixel 102*b* which output the signal to the signal line 109 at the same time is lower than that in the effective pixel 102*a*. Thus, the period from when the signal of the OB pixel 102*b* is output to the signal line 109 until the potential at the signal line 109 becomes statically determinate at the relevant signal level is longer as compared with the case of the signal of the effective pixel 102*a*. Thus, a case occurs where the TG 110 sets the signal ps from Hi to Lo before the potential at the signal line 109 becomes statically determinate at the signal level of the signal output by the OB pixel 102*b*. In this case, the S-signal holding capacitance 304 holds a signal obtained by amplifying a signal, which has an amplification smaller than that of the signal output by the OB pixel 102*b*, by the amplification unit 105. Therefore, even when the signal based on the output of the OB pixel 102*b* is subtracted from the signal based on the output of the effective pixel 102*a*, the dark current component may not accurately be subtracted in some cases.

In view of the above, in the image pickup apparatus according to the present exemplary embodiment, the vertical scanning circuit 112 sets a Lo potential of the signal pres to be higher in the one frame period during which the mixing of the mutual signals of the pixels 102 in the plurality of rows is performed on the signal line 109 as compared with the other one frame during which the above-described mixing is not performed. While the vertical scanning circuit 112 sets the Lo potential of the signal pres to be higher, the potential at the FD unit 203 is increased via a parasitic capacitance between a control node of the transistor 204 and the FD unit 203. Accordingly, as compared with the case where the number of rows in which the signal output from each of the pixels 102 is mixed with one another is relatively high, it is possible to shorten the period from when the signal of the pixel 102 is output to the signal line 109 until the potential at the signal line 109 becomes statically determinate in the case where the number of rows is relatively low. In a case where a parasitic capacitance exists between a line for supplying the signal pres to the pixels 102 in the respective rows and the FD unit 203, the potential at the FD unit 203 is facilitated to be increased by increasing the Lo potential of the signal pres.

Figure 5:
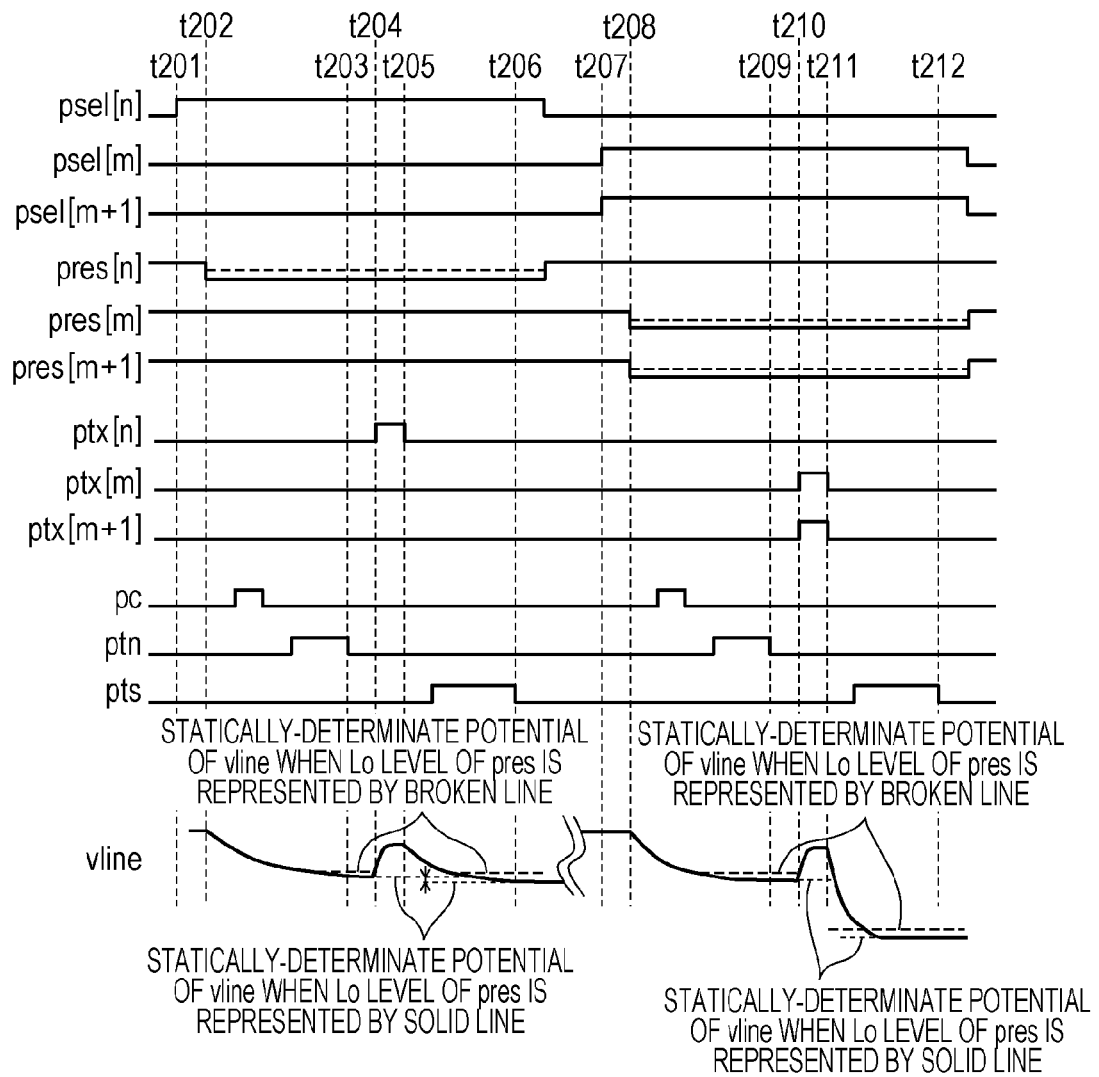
FIG. 5 illustrates another example of the operation of the image pickup apparatus.

FIG. 5 illustrates an operation of the image pickup apparatus according to the present exemplary embodiment.

The operation illustrated in FIG. 5 is the same as the operation illustrated in FIG. 3 except for the potential of the signal pres[n], the potential of the signal pres[m], and the potential of the signal pres[m+1].

In FIG. 5, the potentials of the signal pres[n], the signal pres[m], and the signal pres[m+1] in a case where the signals output by the effective pixels 102a in the plurality of rows are mixed with one another on the single signal line 109 in the one frame are indicated by broken lines. On the other hand, in FIG. 5, the potentials of the signal pres[n], the signal pres[m], and the signal pres[m+1] in a case where the signals output by the effective pixels 102a in the plurality of rows are not mixed with one another on the single signal line 109 in the one frame are indicated by solid lines.

The potential at the signal line 109 is indicated by vline illustrated in FIG. 5.

Hereinafter, the operation of setting the potentials of the signal pres[n], the signal pres[m], and the signal pres[m+1] to be the potentials indicated by the broken line will be described.

At the time t202, the vertical scanning circuit 112 sets the signal pres[n] to Lo. Accordingly, the signal pres[n] is set to have the potential indicated by the broken line.

The parasitic capacitance exists between the control node of the transistor 204 and the FD unit 203. With this parasitic capacitance, the potential at the FD unit 203 fluctuates depending on the potential at the control node of the transistor 204. As illustrated in FIG. 5, the potential at the FD unit 203 after the signal pres[n] turns to Lo is decreased with respect to the potential at the FD unit 203 when the signal pres[n] is at Hi.

Meanwhile, the case where the Lo potential of the signal pres[n] is set as the potential indicated by the solid line will be described. In that case, with respect to the case where the Lo potential of the signal pres[n] is the potential indicated by the broken line, the period from when the signal pres[n] turns to Lo until the potential at the FD unit 203 is statically determinate is lengthened. Thus, as indicated by vline in FIG. 5, as compared with the case where the Lo potential of the signal pres[n] is the potential indicated by the broken line, the period from when the signal pres[n] turns to Lo until the potential at the signal line 109 is statically determinate is lengthened in a case where the Lo potential of the signal pres[n] is the potential indicated by the solid line. When the TG 110 sets the signal ptn from Hi to Lo before the potential at the signal line 109 is statically determinate, the potential of the N-signal held by the N-signal holding capacitance 303 is different from the potential of the N-signal held in a case where the potential at the FD unit 203 becomes statically determinate.

On the other hand, in the operation illustrated in FIG. 5, the Lo potential of the signal pres[n] is set as the potential indicated by the broken line. Accordingly, it is possible to shorten the period until the potential at the signal line 109 becomes statically determinate. Thus, the N-signal holding capacitance 303 can hold the N-signal in a state in which the potential at the signal line 109 is statically determinate.

Similarly, the S-signal holding capacitance 304 can also hold the S-signal in which the potential at the signal line 109 is statically determinate.

Accordingly, the image pickup apparatus according to the present exemplary embodiment can hold the S-signal and the N-signal of the OB pixel 102b after the potential at the signal line 109 becomes statically determinate. As a result, it is possible to improve the accuracy of the signal of the OB pixel 102b. Accordingly, the signal from which the dark current component is accurately subtracted can be obtained by subtracting the signal based on the output of the OB pixel 102b from the signal based on the output of the effective pixel 102a. Furthermore, the Lo potential of the signal pres of the effective pixel 102a where the mixing of the mutual signals in the plurality of rows is performed on the signal line 109 is set as the same as that of the OB pixel 102b. With this configuration, the image pickup apparatus according to the present exemplary embodiment can obtain the signal from which the dark current component is further accurately subtracted can be obtained.

It is noted that, according to the present exemplary embodiment, the vertical scanning circuit 112 sets the Lo potential of the signal pres to be higher in the one frame period during which the mixing of the mutual signals of the pixels 102 in the plurality of rows is performed on the signal line 109 than that in the other one frame period during which the above-described mixing is not performed. As another example, in the same frame period, the Lo potential of the signal pres may be set to be higher in the OB pixel 102b where the mixing of the mutual signals output from the pixels in the plurality of rows is not performed than that in the effective pixel 102a where the mixing of the mutual signals output from the pixels in the plurality of rows is performed. In this case too, each of the N-signal holding capacitance 303 and the S-signal holding capacitance 304 can obtain the N-signal and the S-signal based on the output of the OB pixel 102b after the potential at the signal line 109 becomes statically determinate. Accordingly, the image pickup apparatus can accurately obtain the S-signal and the N-signal based on the output of the OB pixel 102b. It is noted that the other one frame period during which the above-described mixing is not performed may be a period during which the operation of individually reading out the signals of the effective pixels 102a is performed. Alternatively, the other one frame period during which the above-described mixing is not performed may be a period during which, by electrically connecting the FD units 203 of the mutual effective pixels 102a to one another, charges averaged over the plurality of effective pixels 102a are generated, and the operation of reading out the signal based on the averaged charge is performed.

In addition, according to the present exemplary embodiment, the vertical scanning circuit 112 sets the Lo potential of the signal pres to be higher in a case where the mixing of the signals of the pixels 102 in the plurality of rows on the signal line 109 is performed than that in a case where the above-described mixing is not performed. As another example, the vertical scanning circuit 112 may set a Hi potential of the signal pres to be lower in a case where the mixing of the signals of the pixels 102 in the plurality of rows on the signal line 109 is performed than that in a case where the above-described mixing is not performed. Since the Hi potential of the signal pres is set to be lower, the potential at which the FD unit 203 is reset is decreased. While the potential at which the FD unit 203 is reset is decreased, it is possible to decrease a potential difference between the potential at which the FD unit 203 becomes statically determinate after the transition of the signal ptx from Hi to Lo and the potential in a state in which the FD unit 203 is reset. Accordingly, after the transition of the signal ptx from Hi to Lo, it is possible to shorten the period until the potential at the FD unit 203 becomes statically determinate since the Hi potential of the signal pres is decreased. Thus, the image pickup apparatus in this example can obtain the S-signal and the N-signal based on the output of the OB pixel 102b where the signals of the pixels in the plurality of rows are not mixed with one another on the signal line 109 in a state in which the signal line 109 is statically determinate. It is noted that the vertical scanning circuit 112 may set the Hi potential of the signal pres to be lower in the one frame period during which the mixing of the mutual signals of the pixels 102 in the plurality of rows is performed on the signal line 109 than that in the other one frame period during which the above-described mixing is not performed. In addition, in the same frame period, the Hi potential of the signal pres in the OB pixel 102b where the mixing of the mutual signals output from the pixels in the plurality of rows is not performed may be set to be lower than that in the effective pixel 102a where the mixing of the mutual signals output from the pixels in the plurality of rows is performed.

It is noted that FIG. 5 illustrates that the potential vline at the time t202 and he potential vline at the time t208 are the same potential. However, in a case where the current amount supplied to the signal line 109 at the time t202 is the same as that at the time t208, the potential vline at the time t208 tends to the potential having a larger amplitude than that of the potential vline at the time t202. In the above-described case too, the image pickup apparatus according to the present exemplary embodiment can attain the above-described effect.

Fourth Exemplary Embodiment

With regard to the image pickup apparatus according to the present exemplary embodiment, a difference from the third exemplary embodiment will be mainly described.

The image pickup apparatus according to the present exemplary embodiment sets the voltage difference of the control voltage between ON and OFF of the transistor 202 in the optical black pixel 102b to be lower than the voltage difference of the control voltage between ON and OFF of the transistor 202 in the effective pixel 102a. The control voltage for controlling ON and OFF of the transistor 202 is equivalent to the signal ptx output by the vertical scanning circuit 112.

Figure 6:
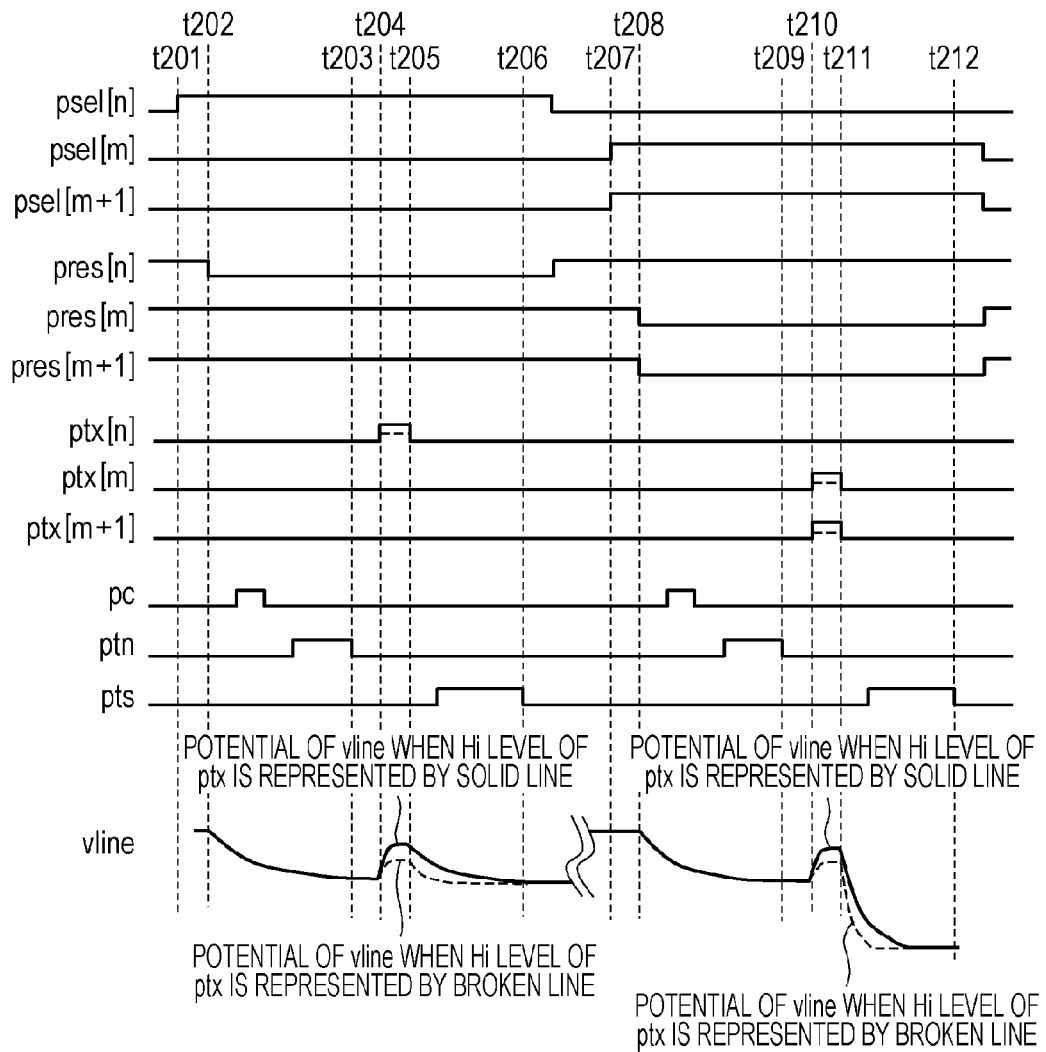
FIG. 6 illustrates another example of the operation of the image pickup apparatus.

FIG. 6 illustrates the operation of the image pickup apparatus according to the present exemplary embodiment.

In the image pickup apparatus according to the present exemplary embodiment, the vertical scanning circuit 112 sets the Hi potential of the signal ptx to be lower in the one frame period during which the mixing of the mutual signals of the pixels 102 in the plurality of rows is performed on the signal line 109 than that in the other one frame period during which the above-described mixing is not performed. Accordingly, an upward swing width of the potential at the FD unit 203 when the signal ptx is set to Hi is decreased. Accordingly, it is possible to shorten the period until the potential at the signal line 109 becomes statically determinate after the transition of the signal ptx from Hi to Lo. Accordingly, the S-signal holding capacitance 304 can hold the S-signal based on the output of the OB pixel 102b where the mixing of the mutual signals of the pixels in the plurality of rows on the signal line 109 is not performed after the potential at the signal line 109 becomes statically determinate. Thus, by subtracting the signal based on the output of the OB pixel 102b from the signal based on the output of the effective pixel 102a, the signal from which the dark current component is accurately subtracted can be obtained. Furthermore, the Hi potential of the signal ptx of the effective pixel 102a where the mixing of the mutual signals in the plurality of rows is performed on the signal line 109 is set to be the same as that of the OB pixel 102b. With this configuration, the image pickup apparatus according to the present exemplary embodiment can obtain the signal from which the dark current component is further accurately subtracted can be obtained.

It is noted that the Hi potential of the signal ptx may be set to be lower in the OB pixel 102b where the mixing of the mutual signals output from the pixels in the plurality of rows is not performed than that in the effective pixel 102a where the mixing of the mutual signals output from the pixels in the plurality of rows is performed in the same frame period.

In addition, the vertical scanning circuit 112 may set the Lo potential of the signal ptx to be higher in the one frame period during which the mixing of the mutual signals of the pixels 102 in the plurality of rows is performed on the signal line 109 than that in the other one frame period during which the above-described mixing is not performed. Accordingly, with the parasitic capacitance between the control node of the transistor 202 and the FD unit 203, the potential at the time of the reset of the FD unit 203 is set to be increased. In addition, the amplitude between Hi and Lo of the signal ptx is also decreased. Accordingly, the upward swing of the potential at the FD unit 203 which occurs at the time of the transition of the signal ptx from Lo to Hi is suppressed by increasing the Lo potential of the signal ptx. Accordingly, after the transition of the signal ptx from Hi to Lo, the period until the potential at the signal line 109 becomes statically determinate is shortened by increasing the Lo potential of the signal ptx. Therefore, also in a case where the Lo potential of the signal ptx is increased, the same effect as the case where the Hi potential of the signal ptx is decreased can be attained. It is noted that the Lo potential of the signal ptx may be set to be higher in the OB pixel 102b where the mixing of the mutual signals output from the pixels in the plurality of rows is not performed than that in the effective pixel 102a where the mixing of the mutual signals output from the pixels in the plurality of rows is performed in the same frame period.

The image pickup apparatus according to the present exemplary embodiment may be operated in combination with the operation described in the third exemplary embodiment.

The image pickup apparatus according to the first to fourth exemplary embodiments may adopt a configuration of further including a dummy pixel in which the photoelectric conversion unit 201 provided in the OB pixel 102b is omitted. In this case, the current supplied to the dummy pixel by the current supply unit 104 and the respective signals supplied to the dummy pixel by the vertical scanning circuit 112 can be the same as those in the OB pixel 102b.

It is noted that FIG. 6 illustrates that the potential vline at the time t202 and he potential vline at the time t208 are the same potential. However, in a case where the current amount supplied to the signal line 109 at the time t202 is the same as that at the time t208, the potential vline at the time t208 tends to the potential having a larger amplitude than that of the potential vline at the time t202. In the above-described case too, the image pickup apparatus according to the present exemplary embodiment can attain the above-described effect.

Fifth Exemplary Embodiment

With regard to the image pickup apparatus according to the present exemplary embodiment, a difference from the first exemplary embodiment will be mainly described.

In the image pickup apparatus according to the first exemplary embodiment, the period from the signal is output to the signal line 109 until the potential at the signal line 109 becomes statically determinate at the relevant signal level is longer for the signal of the OB pixel 102b than that for the effective pixel 102a. The image pickup apparatus according to the present exemplary embodiment sets a current amount of the current supplied to the transistor 205 in the pixel 102 where the mixing of the mutual signals of the pixels in the plurality of rows on the signal line 109 is not performed to be higher than a current amount of the current supplied to the transistor 205 in the pixel 102 where the above-described mixing is performed.

Hereinafter, the current amount of the current supplied to the transistor 205 by the current supply unit 104 will be described.

A transconductance gm of the transistor 205 is represented by Expression (1) below.

$$gm=\sqrt{\{(2\ \mu Cox)(W/L)Id\}} \quad (1)$$

μ denotes a carrier mobility, Cox denotes a gate capacitance of the transistor 205 per unit area, W denotes a channel length of the transistor 205, L denotes a channel width of the transistor 205, and Id denotes a drain current supplied to the transistor 205. As gm is increased, a driving force of the transistor 205 is increased. Therefore, as gm is increased, the period from the transition of the signal ptx from Hi to Lo until the signal line 109 becomes statically determinate is shortened. As described in the first exemplary embodiment and the second exemplary embodiment, in the same frame, the image pickup apparatus mixes the signals output by the pixels 102 in X rows (X is a number higher than or equal to 2) with one another and mixes the signals output by the pixels 102 in Y rows that are fewer than the X rows with one another.

A current value of the current supplied to the pixels 102 where the signals output by the pixels 102 in the X rows are mixed with one another is set as Idm, and a current value of the current supplied to the pixels 102 where the signals output by the pixels 102 in the Y rows are mixed with one another is set as Idn. The current supply unit 104 sets values of the current value Idm and the current value Idn such that Expression (2) below is established.

$$Idm=Idn\times Y/X \quad (2)$$

Figure 7:
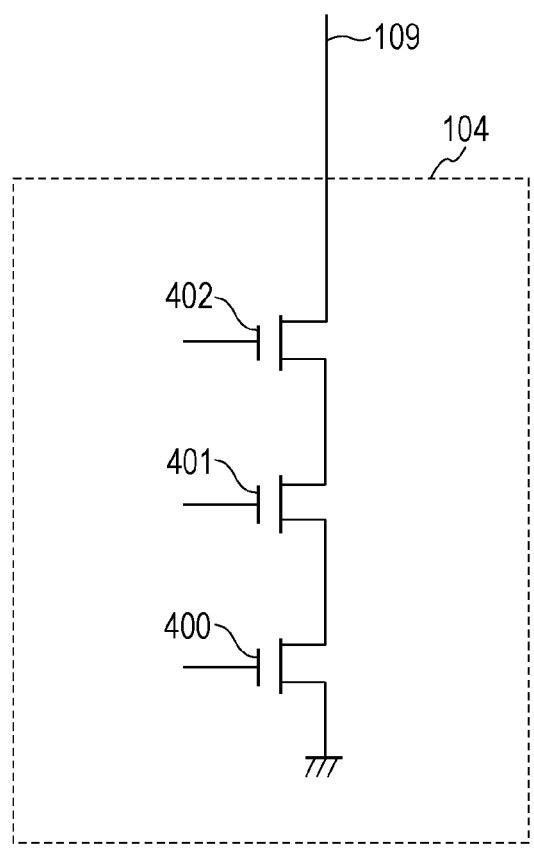
FIG. 7 illustrates an example of a configuration of a current supply unit.

FIG. 7 illustrates a configuration of the current supply unit 104 according to the present exemplary embodiment.

A transistor 401 constitutes a cascode circuit together with a transistor 400 so that the transistor 400 stably supplies a current. A transistor 402 is a switch for switching ON and OFF of current supply to the signal line 109. A voltage supply that is not illustrated in the drawing supplies a predetermined voltage to an input node of the transistor 400. Accordingly, the transistor 400 supplies a current having a current value based on the voltage supplied to the input node of the transistor 400 to the signal line 109. The voltage supply that is not illustrated in the drawing supplies a predetermined voltage to an input node of the transistor 401. Accordingly, a drain potential at the transistor 400 is kept constant. Hereinafter, descriptions will be given while the transistor 400, the transistor 401, and the transistor 402 are all an N-type MOS transistor.

In order that the current supply unit 104 changes the current value of the current supplied to the signal line 109, one or both of the voltages values of the voltage supplied to the input node of the transistor 400 and the voltage supplied to the input node of the transistor 401 may be changed.

The current supply unit 104 supplies both the current having the current value Idm and the current having the current value Idn that is higher than the current value Idm to the signal line 109 in the same frame period. In a case where the current supply unit 104 supplies the current having the current value Idn, as compared with the case where the current having the current value Idm is supplied, one or both of the voltage supplied to the input node of the transistor 400 and the voltage supplied to the input node of the transistor 401 may be increased. Accordingly, in the mixing of the mutual signals of the pixels 102 in the Y rows that are fewer than the X rows, as compared with the case where the current having the current value Idm is supplied, it is possible to shorten the period from the transition of the signal ptx from Hi to Lo until the signal line 109 becomes statically determinate.

A case exists where the signals of the effective pixels 102a in the plurality of rows are mixed with one another on the signal line 109, and the signals of the OB pixels 102b are individually read out. In this case, when the signals of the effective pixel 102a are read out, the current supply unit 104 supplies the current having the current value Idm to the signal line 109. Meanwhile, when the signals of the OB pixels 102b are read out, the current supply unit 104 supplies the current having the current value Idn to the signal line 109. Accordingly, the N-signal holding capacitance 303 can hold the N-signal based on the output of the OB pixel 102b in the state in which the potential at the signal line 109 is statically determinate. Similarly, the S-signal holding capacitance 304 can hold the S-signal based on the output of the OB pixel 102b in the state in which the potential at the signal line 109 is statically determinate. Accordingly, the same effect as the effect described in the third exemplary embodiment can be attained.

It is noted that the current value of the current supplied by the current supply unit 104 may be set to be higher in the one frame period during which the mixing of the signals of the pixels 102 in the plurality of rows on the signal line 109 is not performed than that in the other one frame period during which the above-described mixing is performed.

Sixth Exemplary Embodiment

With regard to the image pickup apparatus according to the present exemplary embodiment, a difference from the fifth exemplary embodiment will be mainly described.

The image pickup apparatus according to the present exemplary embodiment outputs both an image signal for generating an image and a focus detection signal used for a focus detection of an image plane phase difference AF system.

In the image pickup apparatus according to the present exemplary embodiment, a focus detection pixel where light is shielded in a part of the photoelectric conversion unit 201 is arranged in the effective pixel area 101*a*. A signal based on an output of the focus detection pixel where light is shielded in the part of the photoelectric conversion unit 201 corresponds to the focus detection signal.

It is noted that the signal output by the effective pixel 102*a* is an image pickup signal corresponding to a signal for generating an image. Hereinafter, the effective pixel 102*a* will be referred to as image pickup pixel.

Figure 8A:
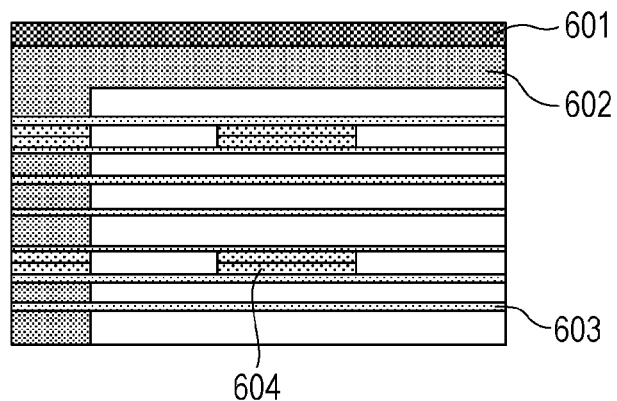
FIGS. 8A and 8B illustrate another example of the configuration of the image pickup apparatus and an order of signals output by the image pickup apparatus and current values of a current supply unit.

FIG. 8A illustrates an arrangement of the pixel 102 of the image pickup apparatus according to the present exemplary embodiment. The image pickup apparatus according to the present exemplary embodiment includes a dummy pixel row 601 in which the dummy pixel is arranged and an OB pixel row 602 in which the OB pixel is arranged. Furthermore, the image pickup apparatus according to the present exemplary embodiment includes an image pickup row 603 in which the image pickup pixel is arranged and a focus detection row 604 in which the focus detection pixel and the image pickup pixel are arranged. The OB pixel arranged in the OB pixel row 602 has the same configuration as the OB pixel 102*b* described in the first exemplary embodiment. The image pickup pixel has the same configuration as the effective pixel 102*a* described in the first exemplary embodiment. The dummy pixel arranged in the dummy pixel row 601 has the configuration in which the photoelectric conversion unit 201 provided in the OB pixel 102*b* is omitted. The configuration of the current supply unit 104 according to the present exemplary embodiment has the same configuration as the current supply unit 104 described in the fifth exemplary embodiment.

Each of the current supply units 104 in the respective columns has a configuration in which the current having either the current value Idm or the current value Idn can be switched for each column to be supplied.

The configuration of the signal processing circuit 103 according to the present exemplary embodiment has the same configuration as the configuration of the signal processing circuit 103 described in the first exemplary embodiment.

Figure 8B:
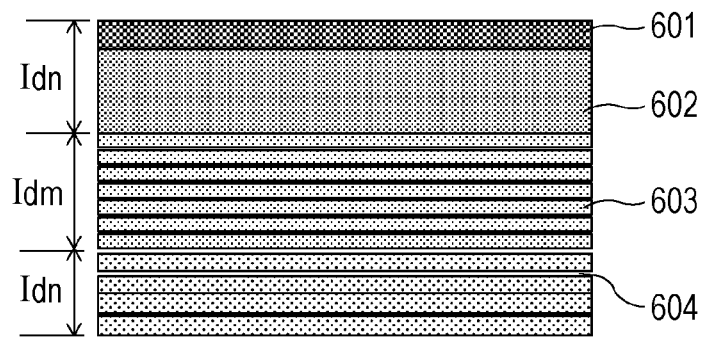

FIG. 8B illustrates an order of the signals output by the image pickup apparatus illustrated in FIG. 8A and current values supplied by the current supply unit 104. The vertical scanning circuit 112 sequentially scans the dummy pixel row 601 and the OB pixel row 602. Thereafter, the vertical scanning circuit 112 scans the image pickup row 603 and the focus detection row 604. It is noted that, in the image pickup apparatus according to the present exemplary embodiment, with regard to the image pickup row 603, the signals of the image pickup pixels in a plurality of rows are mixed with one another on the signal line 109. On the other hand, with regard to the other pixels including the dummy pixel, the OB pixel, and the focus detection pixel, the image pickup apparatus according to the present exemplary embodiment individually reads out for one row each. In a period during which the vertical scanning circuit 112 scans the image pickup row 603, the current supply unit 104 supplies the current having the current value Idm to the signal line 109. On the other hand, in a period during which the vertical scanning circuit 112 scans the other pixel row, the current supply unit 104 supplies the current having the current value Idn to the signal line 109. Accordingly, the image pickup apparatus according to the present exemplary embodiment has the same effect as the image pickup apparatus according to the fifth exemplary embodiment. Furthermore, with regard to the signals of the focus detection pixel and the dummy pixel too, the image pickup apparatus according to the present exemplary embodiment can obtain the N-signal and the S-signal in a state in which the potential at the signal line 109 is statically determinate. Since the image pickup apparatus outputs the focus detection signal having the improved accuracy, it is possible to improve the accuracy of the focus detection.

Seventh Exemplary Embodiment

Figure 9:
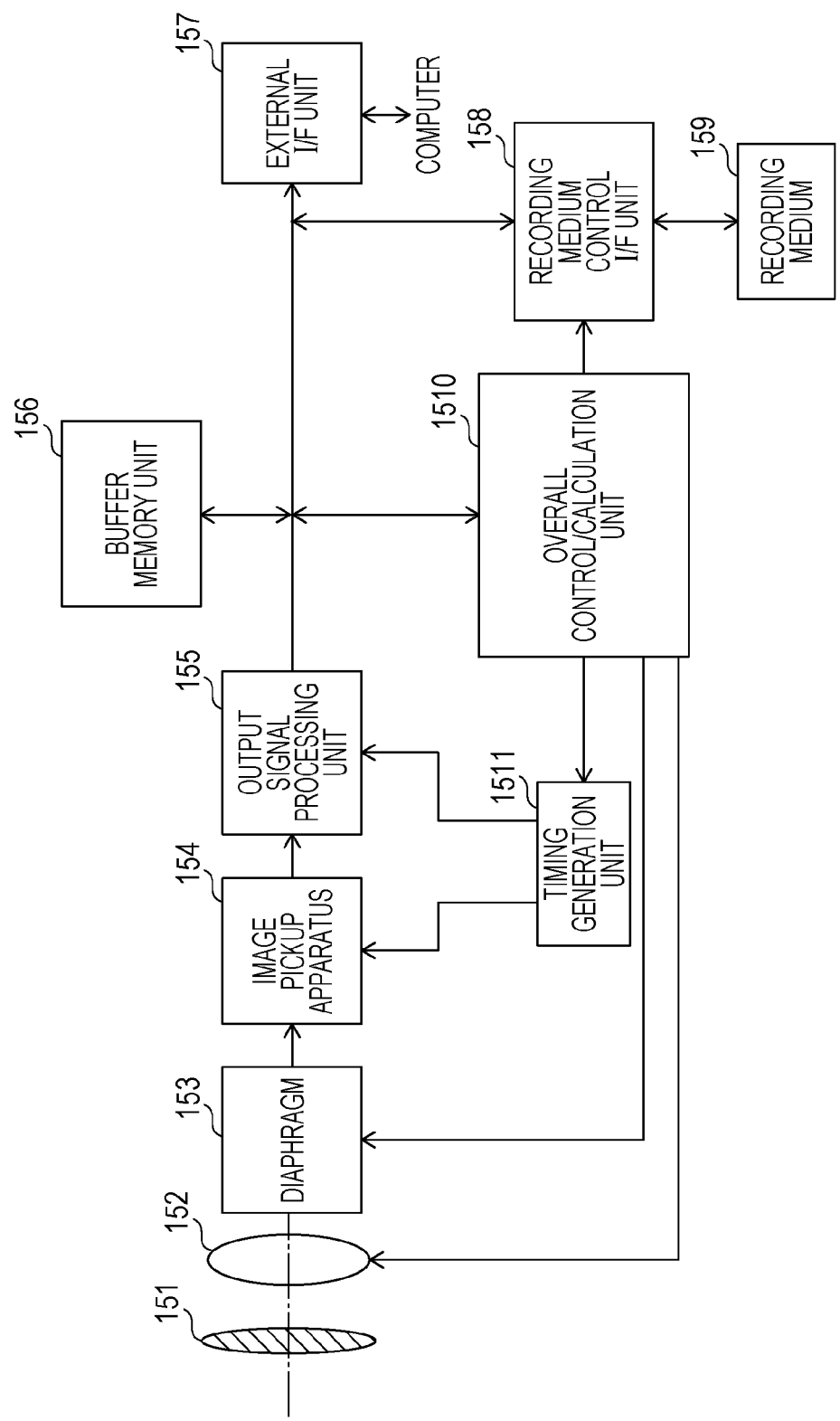
FIG. 9 illustrates an example of a configuration of an image pickup system.

The image pickup apparatus described in the first exemplary embodiment to the sixth exemplary embodiment can be applied to various image pickup systems. Examples of the image pickup systems include a digital still camera, a digital camcorder, a monitoring camera, and the like. FIG. 9 is a schematic diagram of an image pickup system where the image pickup apparatus according to any one of the first exemplary embodiment to the sixth exemplary embodiment of the present invention is applied to the digital still camera as the example of the image pickup system.

The image pickup system exemplified in FIG. 9 includes an image pickup apparatus 154, a barrier 151 for protecting a lens, a lens 152 that focuses an optical image of a subject on the image pickup apparatus 154, and a diaphragm 153 for varying a quantity of light that passes through the lens 152. The lens 152 and the diaphragm 153 constitute an optical system that focuses light on the image pickup apparatus 154. The image pickup system exemplified in FIG. 9 also includes an output signal processing unit 155 that performs processing on an output signal that is output from the image pickup apparatus 154.

The output signal processing unit 155 performs AD conversion for converting an analog signal output by the image pickup apparatus 154 into a digital signal. In addition to this, the output signal processing unit 155 also performs an operation of outputting image data by appropriately performing various corrections and compression. The image pickup system exemplified in FIG. 9 further includes a buffer memory unit 156 that temporarily stores the image data and an external interface unit (external I/F unit) 157 used to communicate with an external computer or the like. The image pickup system further includes a recording medium 159 such as a semiconductor memory that performs recording or readout of the image pickup data and a recording medium control interface unit (recording medium control I/F unit) 158 that performs recording or readout with respect to the recording medium 159. It is noted that the recording medium 159 may be built in the image pickup system or may be detachably attached to the image pickup system.

The image pickup system further includes an overall control/calculation unit 1510 that controls various calculations and the entire digital still camera and a timing generation unit 1511 that outputs various timing signals to the image pickup apparatus 154 and the output signal processing unit 155. Herein, the timing signals and the like may be input from an external part, and it suffices when the image pickup system includes at least the image pickup apparatus 154 and the output signal processing unit 155 that processes the output signal that is output from the image pickup apparatus 154. As described above, the image pickup system according to the present exemplary embodiment can perform the image pickup apparatus while the image pickup apparatus 154 is applied to the image pickup system.

In the case of the image pickup apparatus that performs the image plane phase difference AF according to the sixth exemplary embodiment, the image pickup apparatus 154 outputs the focus detection signal based on the signal output by the focus detection pixel and the image pickup signal to the output signal processing unit 155. The output signal processing unit 155 detects whether or not a focused state is established by using the focus detection signal. The output signal processing unit 155 also generates the image by using the image pickup signal. In a case where the output signal processing unit 155 detects that the focused state is not established, the overall control/calculation unit 1510 drives the optical system in a direction to establish the focus state. The output signal processing unit 155 detects again whether or not the focused state is established by using the focus detection signal output from the image pickup apparatus 154. Hereinafter, the image pickup apparatus 154, the output signal processing unit 155, and the overall control/calculation unit 1510 repeat this operation until the focused state is established.

It is noted that the above-described exemplary embodiments are all merely specific examples for carrying out the present invention, and the technical scope of the present invention should not be construed to a limited extent by these examples. That is, the present invention can be carried out in various modes without departing from the technical spirit or the main characteristics. In addition, the respective exemplary embodiments described above may be combined with each other to carry out the present invention.

Accordingly, it is possible to more appropriately perform both the readout of the signal of the reference pixel and the mixing of the mutual signals output by the plurality of effective pixels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-095493, filed May 2, 2014, which is hereby incorporated by reference herein in its entirety.

What is claimed is:

1. A driving method for an image pickup apparatus that includes a plurality of pixels arranged in rows and columns, and a plurality of signal lines each being arranged corresponding to one of the columns of the plurality of pixels,
   the plurality of pixels including
      a plurality of effective pixels arranged in the rows and the columns, and
      a plurality of reference pixels arranged in at least one row and the columns corresponding to the columns in which the plurality of effective pixels are arranged and outputting only a signal of a noise level,
   each of the plurality of effective pixels including a photoelectric conversion unit to perform a photoelectric conversion of incident light and an amplification transistor having an input node for inputting charges generated by the photoelectric conversion unit, and
   each of the plurality of reference pixels including an amplification transistor having an input node,
   the driving method comprising:
   a first operation of overlapping periods, without electrically connecting the input node of the amplification transistor in each of a first number of effective pixels among the plurality of effective pixels, to each other, each period being a period during which the amplification transistor in each of the first number of effective pixels outputs a signal to common one of the signal lines, and
   a second operation of:
      individually outputting the signal of the noise level to the single signal line by the amplification transistor in each of the plurality of reference pixels, or
      overlapping periods, without electrically connecting the input node of the amplification transistor in each of a second number of reference pixels among the plurality of reference pixels, to each other, each period being a period during which the amplification transistor in each of the second number of reference pixels outputs a signal common one of the signal lines, the second number being fewer than the first number.

2. The driving method for the image pickup apparatus according to claim 1,
   wherein each of the plurality of reference pixels further includes a floating diffusion unit and a reset transistor that controls ON and OFF of reset of the floating diffusion unit on the basis of a control voltage output to a control node, and the amplification transistor outputs a signal based on a potential at the floating diffusion unit to the signal line,
   wherein each of the plurality of effective pixels further includes a floating diffusion unit and a reset transistor that controls ON and OFF of reset of the floating diffusion unit on the basis of a control voltage output to a control node, the charges are output from the photoelectric conversion unit to the floating diffusion unit, and the amplification transistor outputs a signal based on a potential at the floating diffusion unit to the signal line, and
   wherein a voltage difference of the control voltage between ON and OFF of the reset transistor in each of the plurality of reference pixels is set to be smaller than a voltage difference of the control voltage between ON and OFF of the reset transistor in the effective pixel.

3. The driving method for the image pickup apparatus according to claim 1,
   wherein each of the plurality of reference pixels further includes a floating diffusion unit and a reset transistor that controls ON and OFF of reset of the floating diffusion unit on the basis of a control voltage output to a control node, and the amplification transistor outputs a signal based on a potential at the floating diffusion unit to the signal line,
   wherein each of the plurality of effective pixels further includes a floating diffusion unit and a reset transistor that controls ON and OFF of reset of the floating diffusion unit on the basis of a control voltage output to a control node, the charges are output from the photoelectric conversion unit to the floating diffusion unit, and the amplification transistor outputs a signal based on a potential at the floating diffusion unit to the signal line, and
   wherein, in a first frame period during which the first operation is performed and a second frame period during which signals are read out from the plurality of effective pixels without performing the first operation, a voltage difference of the control voltage between ON and OFF of the reset transistor in the plurality of reference pixels and the plurality of effective pixels in the first frame period is set to be smaller than a voltage difference of the control voltage between ON and OFF of the reset transistor in the plurality of reference pixels and the plurality of effective pixels in the second frame period.

4. The driving method for the image pickup apparatus according to claim 1,
wherein each of the plurality of reference pixels and the amplification transistor provided in each of the plurality of pixels perform a source follower operation by using a current supplied to the signal line and a voltage supplied to the amplification transistor, and
wherein a current value of the current supplied to the signal line in the second operation is set to be higher than a current value of the current supplied to the signal line in the first operation.

5. The driving method for the image pickup apparatus according to claim 1,
wherein each of the plurality of reference pixels and the amplification transistor provided in each of the plurality of pixels perform a source follower operation by using a current supplied to the signal line, and
wherein, in a first frame period during which the first operation is performed and a second frame period during which signals are read out from the plurality of effective pixels without performing the first operation, a current value of the current supplied to the signal line in the second frame period is set to be higher than a current value of the current supplied to the signal line in the first frame period.

6. The driving method for the image pickup apparatus according to claim 1,
wherein the plurality of pixels include a focus detection pixel including a photoelectric conversion unit obtained by shielding light in a part of the photoelectric conversion unit, and
wherein a signal is read out from the amplification transistor in the focus detection pixel in the second operation.

7. The driving method for the image pickup apparatus according to claim 1,
wherein each of the plurality of reference pixels includes a light-shielded photoelectric conversion unit, and the amplification transistor in each of the plurality of reference pixels outputs a signal based on charges of the light-shielded photoelectric conversion unit.

8. The driving method for the image pickup apparatus according to claim 1,
wherein each of the plurality of reference pixels includes a floating diffusion unit, a light-shielded photoelectric conversion unit, and a transfer transistor that controls ON and OFF of transfer of charges from the light-shielded photoelectric conversion unit to the floating diffusion unit on the basis of a control voltage output to a control node, and the amplification transistor outputs a signal based on a potential at the floating diffusion unit to the signal line,
wherein each of the plurality of effective pixels includes a floating diffusion unit and a transfer transistor that controls ON and OFF of transfer of charges from the light-shielded photoelectric conversion unit to the floating diffusion unit on the basis of a control voltage output to a control node, and the amplification transistor outputs a signal based on a potential at the floating diffusion unit to the signal line, and
wherein a voltage difference of the control voltage between ON and OFF of the transfer transistor in the reference pixel is set to be smaller than a voltage difference of the control voltage between ON and OFF of the transfer transistor in the effective pixel.

9. The driving method for the image pickup apparatus according to claim 1,
wherein each of the plurality of reference pixels includes a floating diffusion unit, a light-shielded photoelectric conversion unit, and a transfer transistor that controls ON and OFF of transfer of charges from the light-shielded photoelectric conversion unit to the floating diffusion unit on the basis of a control voltage output to a control node, and the amplification transistor outputs a signal based on a potential at the floating diffusion unit to the signal line,
wherein each of the plurality of effective pixels includes a floating diffusion unit and a transfer transistor that controls ON and OFF of transfer of charges from the light-shielded photoelectric conversion unit to the floating diffusion unit on the basis of a control voltage output to a control node, and the amplification transistor outputs a signal based on a potential at the floating diffusion unit to the signal line, and
wherein, in a first frame period during which the first operation is performed and a second frame period during which signals are read out from the plurality of effective pixels without performing the first operation, a voltage difference of the control voltage between ON and OFF of the transfer transistor in each of the plurality of reference pixels and the plurality of effective pixels in the first frame period is set to be smaller than a voltage difference of the control voltage between ON and OFF of the transfer transistor in each of the plurality of reference pixels and the plurality of effective pixels in the second frame period.

10. The driving method for the image pickup apparatus according to claim 1,
wherein each of the plurality of pixels further includes a selection transistor with which an electric path between the amplification transistor and the signal line is put into a conductive state when the selection transistor is set in an ON state, and the electric path is put into a non-conductive state when the selection transistor is set in an OFF state,
wherein, the connecting the plurality of amplification transistors in the first number of the plurality of effective pixels in the first operation, is performed by setting in the ON state of a plurality of selection transistors in the first number of the plurality of effective pixels,
wherein, the connecting the plurality of amplification transistors in the second number of the plurality of reference pixels in the second operation, is performed by setting in the ON state of a plurality of selection transistors in the second number of the plurality of reference pixels.

11. A driving method for an image pickup apparatus that includes a plurality of pixels arranged in rows and columns, and a plurality of signal lines each being arranged correspond to one of the columns of the plurality of pixels,
the plurality of pixels including a plurality of effective pixels arranged in the rows and the columns, and reference pixels arranged in at least one row and the columns corresponding to the columns in which the plurality of effective pixels are arranged,
each of the plurality of effective pixels including a photoelectric conversion unit to perform a photoelectric conversion of incident light and an amplification transistor having an input node for inputting charges generated by the photoelectric conversion unit, and each of the plurality of reference pixels including a light-shielded photoelectric conversion unit and an amplification transistor having an input node,
the driving method comprising:
a first operation of overlapping periods, without electrically connecting the input node of the amplification transistor in each of a first number of effective pixels among the plurality of effective pixels, to each other, each period being a period during which the amplification transistor in each of the first number of effective pixels outputs a signal to common one of the signal lines, and
a second operation of:
individually outputting the signal of the noise level to the single signal line by the amplification transistor in each of the plurality of reference pixels, or
overlapping periods, without electrically connecting the input node of the amplification transistor in each of a second number of reference pixels among the plurality of reference pixels to the other of the plurality of reference pixels, to each other, each period being a period during which the amplification transistor in each of the second number of reference pixels outputs a signal to common one of signal lines, the second number being fewer than the first number.

12. An image pickup apparatus comprising:
a plurality of pixels arranged in rows and columns;
a plurality of signal lines each being arranged to correspond to one of the columns of the plurality of pixels; and
a control unit that causes the plurality of pixels to perform both a first operation and a second operation,
the plurality of pixels including a plurality of effective pixels arranged in the rows and the columns, and a plurality of reference pixels that are arranged in at least one row and the columns corresponding to the columns in which the plurality of effective pixels are arranged and output only a signal of a noise level,
each of the plurality of effective pixels including a photoelectric conversion unit to perform a photoelectric conversion of incident light and an amplification transistor having an input node to which charges generated by the photoelectric conversion unit are input, and
each of the plurality of reference pixels including an amplification transistor having an input node,
wherein the first operation is an operation of overlapping periods, without electrically connecting the input node of the amplification transistor in each of a first number of effective pixels among the plurality of effective pixels, to each other, each period being a period during which the amplification transistor in each of the first number of effective pixels outputs a signal to common one of the signal lines, and
wherein the second operation is an operation of:
individually outputting the signal of the noise level to the single signal line by the amplification transistor in each of the plurality of reference pixels, or
overlapping periods, without electrically connecting the input node of the amplification transistor in each of the second number of reference pixels among the plurality of reference pixels, to each other, each period is a period during which the amplification transistor in each of the second number of the reference pixels output a signal to common one of the signal lines, the second number being fewer than the first number.

13. The image pickup apparatus according to claim 12, wherein the control unit includes a scanning circuit.

14. The image pickup apparatus according to claim 12, wherein the plurality of pixels include a focus detection pixel including a photoelectric conversion unit obtained by shielding light in a part of the photoelectric conversion unit, and
wherein a signal is read out from the amplification transistor in the focus detection pixel in the second operation.

15. The image pickup apparatus according to claim 12, wherein each of the plurality of reference pixels includes a light-shielded photoelectric conversion unit, and the amplification transistor in each of the plurality of reference pixels outputs a signal based on charges of the light-shielded photoelectric conversion unit.

16. An image pickup system comprising:
an image pickup apparatus; and
an output signal processing unit that processes a signal output from the image pickup apparatus to generate an image,
wherein the image pickup apparatus comprises:
a plurality of pixels arranged in rows and columns,
a plurality of signal lines each being arranged to correspond to one of the columns of the plurality of pixels, and
a control unit that causes the plurality of pixels to perform both a first operation and a second operation,
the plurality of pixels including a plurality of effective pixels arranged in the rows and the columns, and a plurality of reference pixels arranged in at least one row and the columns corresponding to the columns in which the plurality of effective pixels are arranged and outputting only a signal of a noise level,
each of the plurality of effective pixels including a photoelectric conversion unit to perform a photoelectric conversion of incident light and an amplification transistor having an input node for inputting charges generated by the photoelectric conversion unit are input, and
each of the plurality of reference pixels including an amplification transistor having an input node,
wherein the first operation is an operation of overlapping periods, without electrically connecting the input node of the amplification transistor in each of a first number of effective pixels among the plurality of effective pixels, to each other, each period being a period during which the amplification transistor in each of the first number of effective pixels outputs a signal to common one of the signal lines, and
wherein the second operation is an operation of:
individually outputting the signal of the noise level to the single signal line by the amplification transistor in each of the plurality of reference pixels, or
overlapping periods, without electrically connecting the input node of the amplification transistor in each of a second number of reference pixels among the plurality of reference pixels, to each other, each period being a period during which the amplification transistor in each of the second number of reference pixels outputs a signal common one of the signal lines, the second number being fewer than the first number.

17. The image pickup system according to claim 16 comprising:
an optical system that guides the incident light to the image pickup apparatus, wherein the plurality of pixels includes a focus detection pixel including a photoelectric conversion unit obtained by shielding light in a part of the photoelectric conversion unit, wherein a signal is read out from the amplification transistor in the focus detection pixel in the second operation, wherein the image pickup apparatus outputs a focus detection signal based on a signal output by the focus detection pixel and an image pickup signal based on signals output by the plurality of effective pixels to the output signal processing unit, and wherein the output signal processing unit detects whether or not a focus state is established on the basis of the focus detection signal and also generates the image by using the image pickup signal.

* * * * *